United States Patent [19]
Wold

[11] 3,942,173
[45] Mar. 2, 1976

[54] OFFSET ERROR COMPENSATION FOR INTEGRATING ANALOG-TO-DIGITAL CONVERTER

[75] Inventor: Ivar Wold, Medfield, Mass.
[73] Assignee: Analog Devices, Inc., Norwood, Mass.
[22] Filed: July 15, 1974
[21] Appl. No.: 488,415

Related U.S. Application Data

[63] Continuation-in-part of Ser. No. 380,690, July 19, 1973, Pat. No. 3,872,466.

[52] U.S. Cl. 340/347 NT; 340/347 AD; 340/347 CC
[51] Int. Cl.² ........................................ H03K 13/20
[58] Field of Search. 340/347 AD, 347 NT, 347 CC

[56] References Cited
UNITED STATES PATENTS
3,828,347   8/1974   Sacks............................ 340/347 NT Primary Examiner—Charles D. Miller
Attorney, Agent, or Firm—Parmelee, Johnson & Bollinger

[57] ABSTRACT

An analog-to-digital converter of the ramp-integrator type utilizing a special technique to reduce errors due to offset voltages. In a pre-conversion cycle, the integrator first is ramped away from a datum level and then back to that level, by sequential application of opposite-polarity reference signals. A digital net offset error is thereby determined as the difference in clock time between (a) the total time of ramp-up-and-back and (b) a fixed time period set by a clock generator. During the subsequent conversion cycle, the integrator is ramped up by the unknown analog signal and then is ramped back by a reference signal. The time of ramp-up is controlled in accordance with the amount of previously-determined net offset error so as to provide error correction.

In the embodiment disclosed, the ramp-up time during the pre-conversion cycle is set at $k/2$ clock pulses, and the digital offset error is the difference in clock pulse time between the return to datum level and a fixed time of $k$ clock pulses. The ramp-up time during the conversion cycle is terminated at $2k$ clock pulses following start of the pre-conversion cycle, so that the integration time is set at $k-n$ clock pulses where $n$ is the digital error in clock pulses determined in the pre-conversion cycle. The digital output signal is defined as the number of clock pulses between the final return to datum level and the time of $2k$ of clock pulses following the start of the conversion cycle.

8 Claims, 2 Drawing Figures

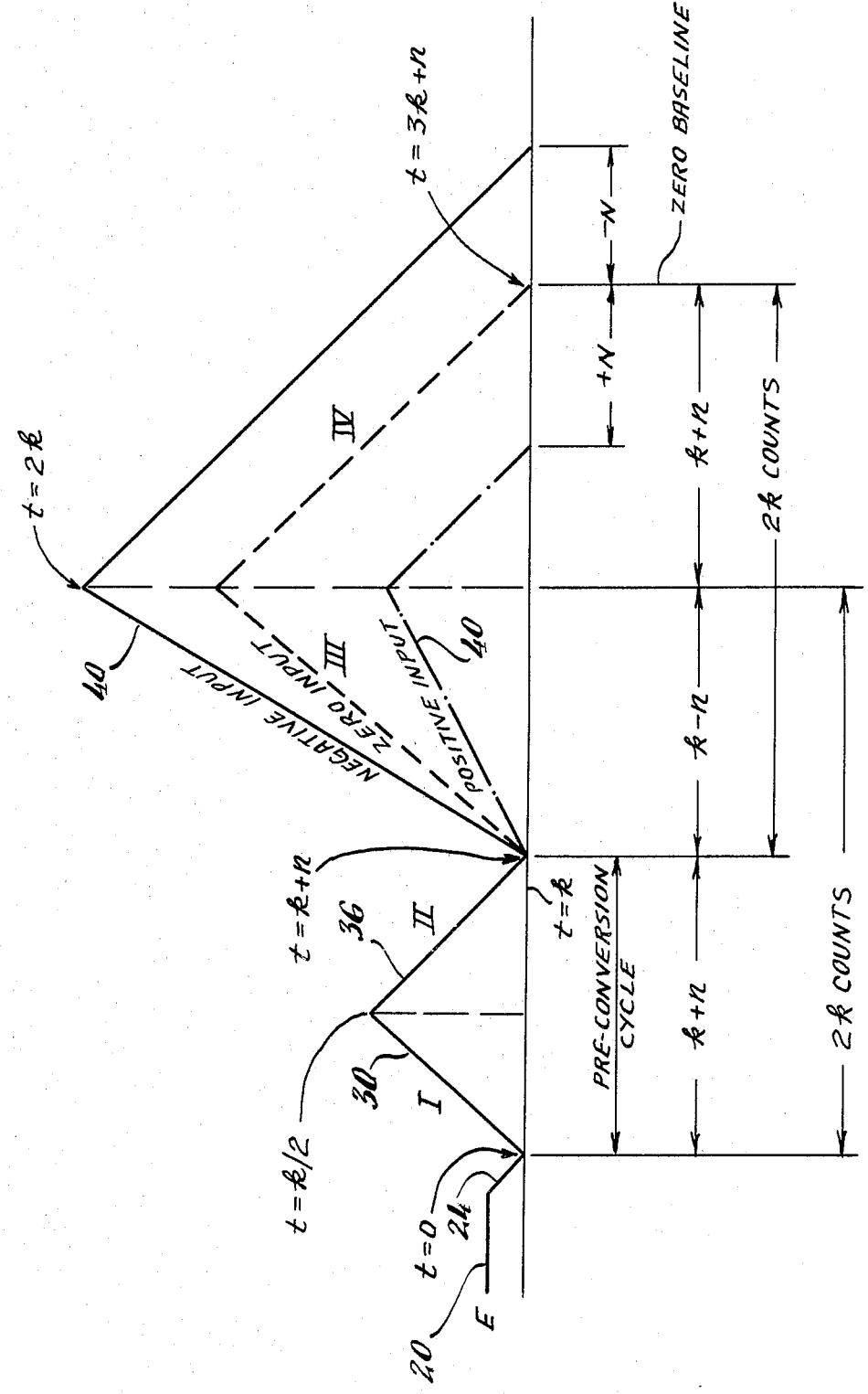

OFFSET ERROR COMPENSATION FOR INTEGRATING ANALOG-TO-DIGITAL CONVERTER

CROSS-REFERENCE TO RELATED APPLICATION

This application is a continuation-in-part of copending application Ser. No. 380,690 filed by the present inventor on July 19, 1973 now U.S. Pat. No. 3,872,466.

BACKGROUND OF THE INVENTION

1. Field of the Invention

This invention relates to analog-to-digital converters of the type comprising a linear integrator which functions together with clock-pulse timing controls to convert an unknown analog signal into a corresponding digital number.

2. Description of the Prior Art

The above-identified copending application, Ser. No. 380,690 discloses a new converter concept representing a significant advance over the well known prior-art converters which have been in general use now for some time. In that new converter, a linear integrator is operated through two successive cycles to effect the analog-to-digital conversion. In the first of these two cycles, an error signal is derived representing the total error-producing offset voltage present in the system. In the second cycle, the unknown analog signal is converted to a corresponding digital output signal by a unique arrangement which corrects the digital output for the error component previously determined in the first cycle to provide a highly accurate conversion.

To develop the offset error signal during the first (or "pre-conversion") cycle, fixed-voltage reference signals of effectively opposite polarity are successively applied to the integrator so that its output first ramps away from a datum level for a first fixed period of time (as measured by a clock-pulse timing control), and then ramps back to the datum level. The error signal is represented by the time difference (in number of clock pulses) between (1) the time the integrator output returns to the datum level, and (2) the end of a second fixed period of time beyond the first fixed period of time and equal in duration to that time period.

During the subsequent conversion cycle, which commences immediately upon the return of the integrator output to datum level in the pre-conversion cycle, the unknown analog signal is applied to the integrator to make its output ramp away from the datum level during a third period of time, and then the integrator output is ramped back to its datum level by applying to the integrator an opposite-polarity reference signal. The magnitude of the unknown signal then is defined digitally by the time difference (in number of clock pulses) between (1) the time the integrator output returns to the datum level and (2) a reference clock time. The polarity of the unknown signal is indicated by whether the final return to the datum level occurred before or after the reference clock time.

In one embodiment of the invention disclosed in that earlier application, the third time period (i.e. the period of integration of the unknown input signal) was controlled by stopping the integration at a pre-set time period after the end of the second time period; this pre-set time period was made equal in duration to the preceding second time period (which in turn was equal in duration to the first time period). For developing the digital output signal at the completion of the conversion cycle, the reference clock time was set as the end of a pre-fixed time period beyond the third time period, with this pre-fixed time period being equal in duration to the immediately preceding pre-set time period.

In the above-described embodiment, the end of the third time period (i.e. the period during which the unknown signal was integrated) always occurred at a fixed time beyond the start of the pre-conversion cycle, whereas the start time of the third period varied, depending upon the magnitdue of the previously defined offset error signal. Thus the digital error signal was automatically introduced into the conversion cycle by correspondingly altering the amount of integration time to which the unknown signal was subjected, compensating for offset error so as to achieve markedly improved accuracy.

In another embodiment of the invention disclosed in the above-identified copending application, a still further improvement in accuracy was obtained by using the digital error signal to control not only the start time of the integration of the unknown signal, but also to control (1) the ending time of that integration, and (2) the reference clock time used as a base for developing the digital output signal. This more precise arrangement did require somewhat more complex equipment, and the circuitry for effecting the needed time controls introduced some unwanted design characteristics. For example, means had to be provided to store the digital error signal developed during the pre-conversion cycle, and means had to be provided to divide the stored digital error signal by a factor of two prior to using that signal for controlling the conversion operation. The present invention is aimed at achieving the desired high accuracy with a considerably simpler circuit arrangement which does not introduce undesirable design characteristics. The present invention also permits a more rapid conversion operation.

SUMMARY OF THE INVENTION

In an embodiment of the present invention, described in detail hereinbelow, there is provided an analog-to-digital converter comprising a linear integrator together with switch-control timing means arranged to operate the integrator through two successive cycles. During the first cycle, referred to herein as the "pre-conversion" cycle, the integrator is ramped away from a datum level for a fixed time interval by a reference signal of one polarity, and then is ramped back to datum level by a second reference signal of magnitude equal to the first reference signal but of opposite effective polarity. The ramp-up time is set at $k/2$ clock pulses (where $k$ is an arbitrary even integer of relatively large magnitude). This pre-conversion cycle in effect measures the total offset voltage then existing in the electronic circuitry, with the magnitude of offset being defined digitally as the time difference (in number of clock pulses $n$) between (1) the return of the integrator output to the datum level, and (2) a fixed time preset at $k$ clock pulses following the start of the pre-conversion cycle.

Immediately upon return to the datum level, the integrator is operated through its conversion cycle wherein the unknown analog signal first is applied to the integrator input to cause it to ramp away from the datum level. This integration continues for a period of time ending at $2k$ clock pulses following the start of the pre-conversion cycle. Thus, the net time of integration of the unknown analog signal is $k-n$ clock pulses. After this ramp-up operation, the integrator is ramped back to the datum level by the same reference signal used to ramp back to datum in the preceding pre-conversion cycle. When the integrator output has returned to datum, the digital output signal is determined by measuring the time difference (in number of clock pulses N) between (1) the time of return to datum level and (2) a time set at $2k$ clock pulses following the start of the conversion cycle, i.e. at a time of $k+n$ clock pulses after the end of the preceding integration of the analog signal.

Since $k$ is a constant, it will be apparent that the time of integration $(k-n)$ of the unknown analog signal is effectively controlled by the variable $n$ representing the measured offset error. The net integration time is determined by a simple add-or-subtract function, in accordance with the sign of $n$. Such control over the integration time can readily be effected merely by terminating the analog signal integration at a fixed time after initiating the pre-conversion cycle. That is, the start time of the integration of the analog signal is a linear add/subtract function of the offset error $n$, so that the integration period can be made equal to $k-n$ clock pulses merely by ending the integration at a fixed time.

Accordingly, in accordance with the present invention it is not necessary to store the number $n$ to control the integration time. Moreover, by developing the digital output signal as the number of clock pulses between the time of return to datum level and a clock time of $2k$ pulses following the start of the conversion cycle, it is not necessary to perform any arithmetic operations (such as division) on the number $n$ in order to control the conversion cycle. This permits the equipment to be of relatively simple design, and yet provides highly accurate performance. In accordance with still another aspect of the invention, the time required for the pre-conversion cycle is substantially reduced relative to the time required for the conversion cycle, thereby providing for a more rapid conversion than previously possible with a converter of this type.

BRIEF DESCRIPTION OF THE DRAWINGS

FIG. 2 is a time-graph illustrating the operation of the converter of FIG. 1.

DETAILED DESCRIPTION OF THE PREFERRED EMBODIMENT

Figure 1:
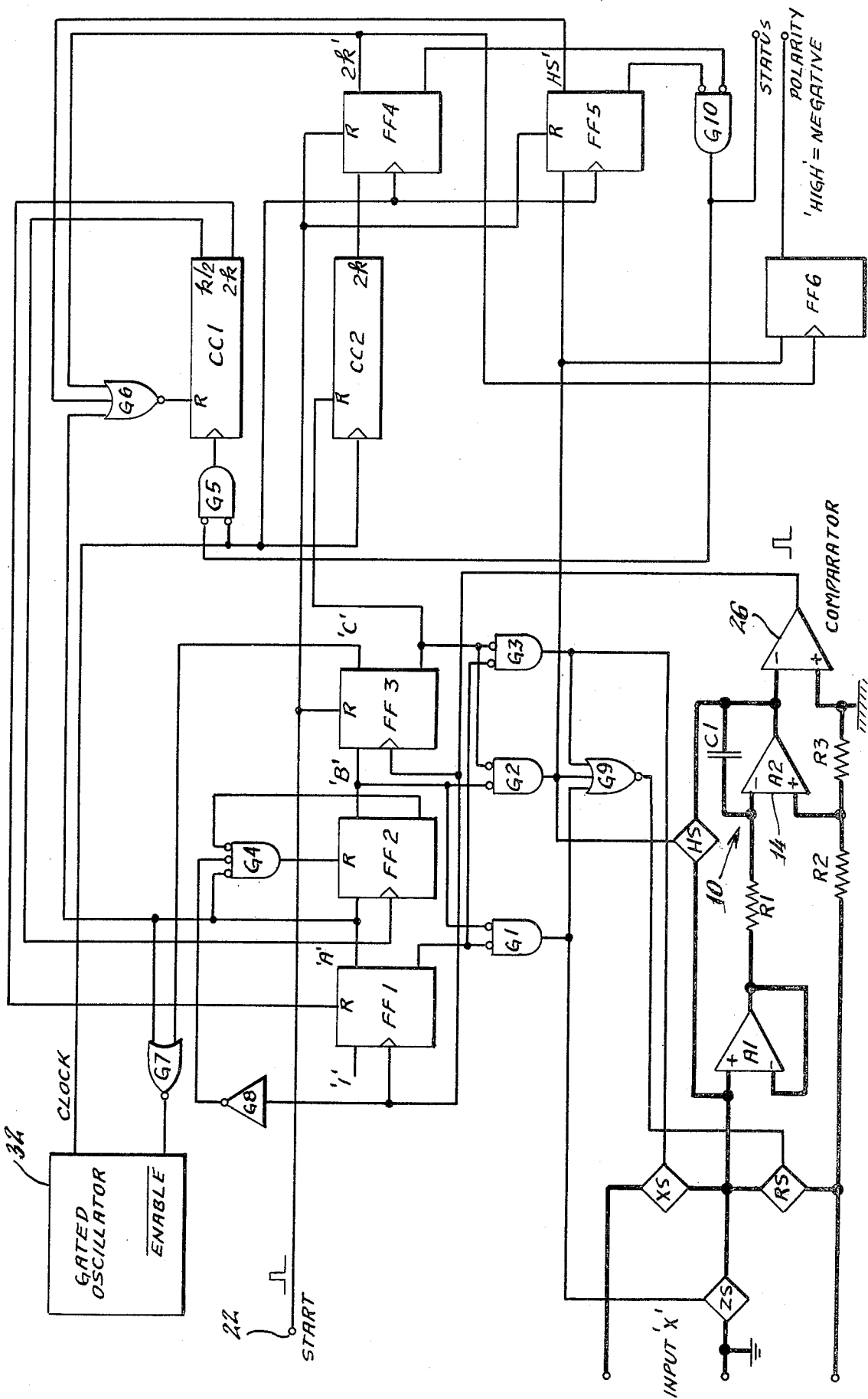
FIG. 1 shows a circuit diagram of a presently preferred embodiment of the invention.

Referring now to the lower left-hand corner of FIG. 1, the presently preferred embodiment of the new converter comprises a linear integrator generally indicated at 10 and including an operational amplifier A2 with a feedback capacitor C1 and an input resistor R1 connected between the negative amplifier input terminal 12 and the output of a buffer amplifier A1. The positive input terminal 14 is supplied with a positive reference voltage E (approximately) from a voltage-divider circuit having two equal series resistors R2, R3 connected between ground and a reference supply of 2E volts.

Prior to the start of a conversion operation, a switch HS is held closed by the HIGH output of a gate G2 (to be referred to in more detail hereinafter) to force the output of integrator 10 to the reference voltage E. This preliminary condition is indicated at 20 on the time graph of FIG. 2, showing the magnitude of the integrator output as a function of time.

To initiate a conversion operation, a start pulse is applied by any conventional means to a Start terminal 22. This pulse will reset flip-flop FF3, turning off gate G2, and thereby opening switch HS. The output of flip-flop FF1 is already LOW at this time, and therefore the outputs of G1 and G3 are low, along with the output of G2. Consequently, the output of G9 will go HIGH, turning on a switch RS to apply the reference voltage 2E to buffer amplifier A1 and thereby to the input resistor R1. The negative input terminal 12 thus receives 2E volts and the positive input terminal 14 receives E volts. The integrator output will therefore ramp negatively, as indicated at 24 in FIG. 2.

The output of integrator 10 is connected to a comparator 26 which produces a positive logic signal when the integrator output reaches 0 (ground). This logic signal clocks the output of FF1 HIGH, causing the output of G1 to go HIGH and the output of G9 to go LOW. Switch RS is thereby opened to remove the 2E reference voltage from the buffer amplifier A1, and a switch ZS is closed to connect ground to the buffer amplifier. This ground signal, when repeated through to input resistor R1, causes the integrator 10 to start a positive up-ramp, indicated at 30 in FIG. 2 and also referred to as phase I.

Simultaneously with closure of switch ZS the output of G7 goes LOW to enable a gated oscillator 32 to produce clock pulses, and the output of G6 goes LOW to remove the Reset of a counter CC1 which thus commences to count the clock pulses applied through G5, now enabled. The up-ramp (phase I) continues until the counter output $k/2$ goes HIGH to clock FF2 and produce a HIGH on its output B. This will cause the output of G1 to go LOW and the output of G9 to go HIGH, turning off switch ZS to terminate the up-ramp, and turning switch RS back on to initiate another down-ramp as indicated at 36 in FIG. 2 (phase II).

During this up-and-down-ramp action of integrator 10, the net input signal to the integrator includes not only the reference voltages referred to above, but also various offset voltages in the system. Thus, the buffer amplifier A1 and the integrator amplifier A2 have total offset voltages of e1 and e2, respectively, with e2 including the voltage developed by the integrator bias current flowing through the input resistor R1. Also, an offset voltage e3 is produced because resistors R2, R3 cannot be made exactly equal, with a further small error caused by the integrator positive bias current flowing into those resistors. All of these error voltages can be lumped conceptually together into a single error voltage designated $e$.

The up-ramp 30 is at a slope proportional to $E+e$ and the down-ramp 36 is at a slope proportional to $-E+e$. It can be shown (see the Appendix forming a part of this application) that under these circumstances the net error voltage $e$ of the system is represented by the number of clock pulses $n$ between (1) the time the integrator output returns to the datum level (at $t = k+n$) and (2) the time $k$, i.e. when the counter CC1 reaches $k$ clock pulses.

After the integrator output reaches datum at the end of phase II, the comparator 26 produces another positive logic signal, thereby clocking FF3 so that its output C goes HIGH (because the output B of FF2 is HIGH at this time). This causes the Reset to be removed from a second counter CC2 which thus begins to count clock pulses. Simultaneously, the output of G3 will go HIGH and produce a LOW at the output of G9. Switch RS therefore opens and switch XS closes, causing the integrator 10 to ramp positively as indicated at 40 (phase III, FIG. 2), at a rate determined by the applied unknown analog voltage X. (It will be apparent that the slope of the ramp is determined not only by the magnitude of X, but also by its polarity. The ramp always will be positive providing the voltage X does not exceed E.)

This up-ramp 40 continues until the output $2k$ of CC1 goes HIGH, resetting FF1 so that its output A goes HIGH. This causes the output of G6 to go HIGH, resetting CC1 to 0. Simultaneously, the output of G3 goes LOW to open switch XS, and the output of G9 goes HIGH to close switch RS. Thus, the integrator 10 commences to ramp negatively as indicated at 42 (phase IV, FIG. 2) at the same rate as during the negative ramp 36. The counter CC2 is held in readiness to count clock pulses to indicate the magnitude of X.

If the input voltage X is positive, the output of integrator 10 will reach datum before the output $2k$ of CC2 goes HIGH. FF4 is provided to synchronize the output $2k$ of CC2 with a clock if CC2 is implemented as a ripple counter. (Note: If CC2 is a synchronous counter, FF4 is not needed.) When the output of comparator 26 goes HIGH, G8 produces an inverted signal which causes the output of G4 to go HIGH, directly resetting FF2 to a LOW output B and producing a HIGH output from G2. This closes HS, and, through G9, opens RS.

With HS closed, the integrator 10 is reset back to its initial state prior to the Start pulse. The HIGH output of G2 is synchronized to the clock by FF5, and the HIGH output of FF5 (HS') causes the output of G6 to go LOW. This removes the Reset from CC1 which thereupon starts counting clock pulses until the synchronized output of FF4 ($2k'$) goes HIGH. At this instant, the output of G10 goes HIGH, disabling gate G5 and turning off the clock pulses at the input of CC1. The number N contained in CC1 is a direct measure of the input voltage X. (For a mathematical analysis, please refer to the Appendix.)

If the input voltage X had been negative, the output of CC2 (i.e. signal $2k$) will go HIGH before the output of the integrator 10 reaches datum. When the synchronized output of FF4 ($2k'$) goes HIGH, the output of G6 will go LOW, removing the Reset from CC1 which thus begins to count clock pulses. This will continue until the input of comparator 26 reaches zero, at which time the synchronized output of FF5 (HS') goes HIGH. This causes the output of G10 to go HIGH, disabling gate G5 and stopping the clock pulses at the input of CC1. The number N contained in CC1 will correspond to the magnitude of the analog voltage X (see Appendix). The output of G10 will be LOW during the entire conversion until the count N has been reached, and therefore serves as a circuit status or ready indicator.

The polarity of the analog signal X is detected by FF6 which is clocked by the output of FF4 ($2k'$) to sample the state of the output of G2. If G2 is HIGH at the instant of FF4 output going HIGH, the output of FF6 will be HIGH to indicate negative polarity. Conversely, if X is positive, the output of FF6 will be LOW following a conversion, to indicate positive polarity.

Accordingly, it will be seen from the above description that the new converter is well suited to the attainment of the objects of the present invention. The error-responsive correction of the time of integration (phase III) is accomplished as a simple add/subtract function of the number $n$, and does not require the number $n$ to be stored in order to effect control over the integration time. The total conversion cycle (phases III and IV) is of constant time duration, and thus is relatively simple to implement. There particularly is no need to perform any arithmetic operations on the number $n$ in order to control the time durations of phase III and IV. And the new converter provides a conversion cycle (phase I and II) having a time duration approximately half as long as in the previous versions of this type of converter, thereby speeding up the overall conversion operation.

Although one specific preferred embodiment of the invention has been described hereinabove in detail, it is to be understood that this is for the purpose of illustrating the principles of the invention and is not to be construed as necessarily limiting of the invention except as required by the prior art.

APPENDIX

The Integral over Phases I and II is zero:

$$1/R1C1 \int_0^{k/2} (E+e)\, dt + 1/R1C1 \int_{k/2}^{(k+n)} (-E+e)\, dt = 0 \quad (1)$$

Differentiating, we get:

$$\frac{k}{2}(E+e) + (k/2+n)(-E+e) = 0$$

$$\frac{kE}{2} + \frac{ke}{2} - \frac{kE}{2} + \frac{ke}{2} + n(-E+e) = 0$$

and hence, we get:

$$n = \frac{ke}{E-e} \quad (2)$$

The Integral over Phases III and IV is also zero:

$$1/R1C1 \int_{(k+n)}^{2k} (E-X+e)\, dt + 1/R1C1 \int_{2k}^{(3k+n-N)} (-E+e)\, dt = 0 \quad (3)$$

Differentiating, we get:
$(k-n)(E-X+e) + (k+n-N)(-E+e) = 0$
$kE-kX+ke-n(E-X+e) -kE+ke =n(-E+e) -N(-E+e)$
$2ke - kX - nE+nX -ne - nE + ne + N(E-e)$
$2ke - kX -2nE + NX + N(E-e)$
$N(E-e) = 2ke - kX +n(X-2E)$
From (2) we substitute for $n$:
$-N(E-e) = 2ke - kX + ke/E-e(X-2E)$
$-N(E-e)^2 = k(2e-X)(E-e) + ke(X-2E)$
$-N(E-e)^2 = k\, 2eE - 2e^2 - XE + Xe - 2eE$
$-N(E-e)^2 = k\, X(2e-E) - 2e^2$ $$N = \frac{kX(E-2e)}{(E-e)^2} + \frac{2e^2}{(E-e)^2}$$

-continued $$N = k \frac{X}{E} \frac{\left(1-2\frac{e}{E}\right)}{\left(1-\frac{e}{E}\right)^2} + \frac{\left(2\frac{e}{E}\right)^2}{\left(1-\frac{e}{E}\right)^2}$$

or, writing $a = e/E$:

$$N = k \frac{X}{E} \frac{(1-2a)}{(1-a)^2} + \frac{2a^2}{(1-a)^2}$$

$$N = k \frac{X}{E} \frac{(1-2a)}{1-2a+a^2} + \frac{2a^2}{1-2a+a^2}$$

By series expansion:

$$N = k \frac{X}{E}(1-a^2-2a^3.....) + (2a^2+4a^3+6a^4...)$$

By design, we can ensure that $e/E$ is small (less than 0.001, say) therefore we can write as a very good approximation $$N = k \frac{X}{E}(1-a^2) + 2Ka^2 \qquad (4)$$

Thus, we have achieved a linear transformation of the input signal from VOLTS to TIME (count) with a gain error, due to $e$ of Gain error: $ka^2$ and an offset error, due to $e$ of Offset error $= 2ka^2$ Note: for $a = 0.001$, $a^2 = 0.000001$ which for $e/E = 0.001$ gives errors in gain and offset of 0.000001 FSD and 0.000002, respectively.

I claim:

1. In an analog-to-digital converter having an integrator which is first operated under control of reference signal means through a pre-conversion cycle wherein the integrator is ramped away from a datum level for a predetermined clock-pulse time and then is ramped back to the datum level, whereby the difference between the clock-pulse time of return to said datum level and a first predetermined clock-pulse time after the start of said pre-conversion cycle defines a digital offset error signal; the integrator thereafter being operated, under control of an unknown input signal and reference signal means, through a conversion cycle wherein the integrator is ramped away from datum level for a first time period and then is ramped back to datum level to develop a digital output signal corresponding to the clockpulse time difference between the second return to said datum level and the end of a second time period following said first time period, said digital output signal indicating the magnitude of the unknown signal applied to the integrator during at least part of said conversion cycle;

that improvement in said converter comprising:

first time-control means arranged to terminate said first time period at a time which is a second predetermined number of clock pulses after said first predetermined clock pulse time, whereby the length of said first time period is a simple add/subtract function of said offset error time difference; and second time-control means arranged to terminate said second time period at a time which is a third predetermined number of clock pulses after the start of said first time period.

2. Apparatus as claimed in claim 1, wherein said first time-control means comprises means to control said first time period to a time duration equal to a predetermined number of clock pulses $k$ less a number $n$ corresponding to the number of clock pulses of said digital error signal.

3. Apparatus as claimed in claim 2, wherein said second time-control means comprises means to control said second time period to a time duration equal to $k$ plus $n$, whereby the total time duration of said first and second time periods is $2k$ as measured in said clock pulses.

4. Apparatus as claimed in claim 3, wherein the time duration of said first ramp away from said datum level, during said pre-conversion cycle, is made equal to $k/2$ clock pulses.

5. Apparatus as claimed in claim 4, wherein said digital error signal is defined by the time difference between said first return to datum level and a time of $k$ clock pulses following the start of said pre-conversion cycle.

6. In an analog-to-digital converter of the type comprising an integrator arranged to produce a linear ramp signal at a ramp rate corresponding to an applied input signal;

first means for operating the integrator through a pre-conversion cycle in which it is (1) ramped by a reference signal away from a datum level for a first clockpulse time period comprising $k/2$ clock pulses (where $k$ is a predetermined even integer) and then is (2) ramped back to the datum level to produce a digital indication of offset error represented by a clock pulse count of $(k+n)$ at the time of return to the datum level where $n$ is an integer reflecting the magnitude of said error;

second means for operating the converter through a conversion cycle in which it is (1) ramped by an applied unknown signal away from a datum level for a time terminating at the end of a second clock-pulse time period comprising a total of $2k$ clock pulses following the start of said preconversion cycle, and then is (2) ramped back to said datum level; and third means for producing a digital signal responsive to the time difference, measured in clock pulses, between the second return to said datum level and a time which is $2k$ clock pulses after the start of said conversion cycle.

7. In an analog-to-digital converter of the type comprising an integrator arranged to produce a linear ramp signal at a ramp rate corresponding to an applied input signal, and wherein the integrator first is operated through a pre-conversion cycle in which it is ramped by reference signal means away from a datum level for a predetermined first clock-pulse time period and then is ramped back to the datum level to produce a digital indication of offset error; and wherein the integrator thereafter is operated through a conversion cycle in which it is ramped by an applied unknown signal away from the datum level for a time terminating at the end of a second predetermined clock-pulse time period beyond said first time period, and then is ramped back to the datum level, the said time periods being so arranged that the clock-pulse time of return to the datum level in said conversion cycle provides information serving to produce a digital signal reflecting the magnitude of the unknown signal;

that improvement in such analog-to-digital converter wherein said first time period is a predetermined fraction of said second time period smaller than one-half.

8. Apparatus as claimed in claim 7, wherein said first time period is exactly one-third of said second time period.

* * * * *